(12) United States Patent
Kai et al.

(10) Patent No.: US 10,727,216 B1
(45) Date of Patent: Jul. 28, 2020

(54) METHOD FOR REMOVING A BULK SUBSTRATE FROM A BONDED ASSEMBLY OF WAFERS

(71) Applicant: SANDISK TECHNOLOGIES LLC, Addison, TX (US)

(72) Inventors: James Kai, Santa Clara, CA (US); Murshed Chowdhury, Fremont, CA (US); Koichi Matsuno, Fremont, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/409,593

(22) Filed: May 10, 2019

(51) Int. Cl.
| | | |
|---|---|---|
| *H01L 21/76* | (2006.01) | |
| *H01L 25/18* | (2006.01) | |
| *H01L 25/065* | (2006.01) | |
| *H01L 25/00* | (2006.01) | |
| *H01L 23/00* | (2006.01) | |

(52) U.S. Cl.
CPC .............. *H01L 25/18* (2013.01); *H01L 24/08* (2013.01); *H01L 24/80* (2013.01); *H01L 25/0657* (2013.01); *H01L 25/50* (2013.01); *H01L 2224/08145* (2013.01); *H01L 2224/80006* (2013.01); *H01L 2224/80895* (2013.01); *H01L 2225/06524* (2013.01); *H01L 2924/1431* (2013.01); *H01L 2924/14511* (2013.01)

(58) Field of Classification Search
CPC combination set(s) only.
See application file for complete search history.

(56) References Cited

U.S. PATENT DOCUMENTS

| | | |
|---|---|---|
| 5,915,167 A | 6/1999 | Leedy |
| 8,614,126 B1 | 12/2013 | Lee et al. |
| 10,115,681 B1 | 10/2018 | Ariyoshi |
| 10,283,493 B1 | 5/2019 | Nishida |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Moin M Rahman
(74) *Attorney, Agent, or Firm* — The Marbury Law Group, PLLC

(57) ABSTRACT

A first wafer including a first substrate, first semiconductor devices overlying the first substrate, and first dielectric material layers overlying the first semiconductor devices is provided. A sacrificial material layer is formed over a top surface of a second wafer including a second substrate. Second semiconductor devices and second dielectric material layers are formed over a top surface of the sacrificial material layer. The second wafer is attached to the first wafer such that the second dielectric material layers face the first dielectric material layers. A plurality of voids is formed through the second substrate. The sacrificial material layer is removed by providing an etchant that etches a material of the sacrificial material layer through the plurality of voids. The substrate is detached from a bonded assembly including the first wafer, the second semiconductor devices, and the second dielectric material layers upon removal of the sacrificial material layer.

20 Claims, 16 Drawing Sheets

(56) References Cited

U.S. PATENT DOCUMENTS

| | | |
|---|---|---|
| 2002/0014673 A1 | 2/2002 | Leedy |
| 2002/0016135 A1 | 2/2002 | Iwasaki et al. |
| 2002/0045297 A1 | 4/2002 | Leedy |
| 2002/0187610 A1 | 12/2002 | Furukawa et al. |
| 2002/0192964 A1 | 12/2002 | Francis |
| 2003/0057513 A1 | 3/2003 | Leedy |
| 2003/0071009 A1 | 4/2003 | Lai et al. |
| 2003/0082847 A1 | 5/2003 | Turner et al. |
| 2003/0082915 A1 | 5/2003 | Iwasaki et al. |
| 2003/0186513 A1 | 10/2003 | Turner et al. |
| 2003/0201500 A1 | 10/2003 | Furukawa et al. |
| 2003/0218182 A1 | 11/2003 | Leedy |
| 2003/0223535 A1 | 12/2003 | Leedy |
| 2003/0235937 A1 | 12/2003 | Mong et al. |
| 2004/0020513 A1 | 2/2004 | Bergman |
| 2004/0121618 A1 | 6/2004 | Moore |
| 2004/0132303 A1 | 7/2004 | Leedy |
| 2004/0150068 A1 | 8/2004 | Leedy |
| 2004/0192045 A1 | 9/2004 | Leedy |
| 2004/0197951 A1 | 10/2004 | Leedy |
| 2004/0259324 A1 | 12/2004 | Brask et al. |
| 2005/0009366 A1 | 1/2005 | Moore |
| 2005/0032333 A1 | 2/2005 | Turner et al. |
| 2005/0051841 A1 | 3/2005 | Leedy |
| 2005/0082626 A1 | 4/2005 | Leedy |
| 2005/0082641 A1 | 4/2005 | Leedy |
| 2005/0085050 A1 | 4/2005 | Draney et al. |
| 2005/0130351 A1 | 6/2005 | Leedy |
| 2005/0156265 A1 | 7/2005 | Leedy |
| 2005/0176174 A1 | 8/2005 | Leedy |
| 2005/0181612 A1 | 8/2005 | Brask et al. |
| 2006/0022263 A1 | 2/2006 | Haase et al. |
| 2006/0068595 A1 | 3/2006 | Seliger et al. |
| 2006/0112986 A1 | 6/2006 | Atwater, Jr. et al. |
| 2006/0219351 A1 | 10/2006 | Kuan et al. |
| 2006/0223301 A1 | 10/2006 | Vanhaelemeersch et al. |
| 2006/0252231 A1 | 11/2006 | Moore et al. |
| 2006/0255341 A1 | 11/2006 | Pinnington et al. |
| 2006/0286767 A1 | 12/2006 | Clarke et al. |
| 2007/0004172 A1 | 1/2007 | Yang |
| 2007/0037379 A1 | 2/2007 | Enquist et al. |
| 2007/0259463 A1 | 11/2007 | Abedini |
| 2007/0259509 A1 | 11/2007 | Kuo |
| 2007/0277861 A1 | 12/2007 | Hiroe et al. |
| 2008/0124896 A1 | 5/2008 | Codding et al. |
| 2008/0138953 A1 | 6/2008 | Challa et al. |
| 2008/0302559 A1 | 12/2008 | Leedy |
| 2009/0008794 A1 | 1/2009 | Wu et al. |
| 2009/0068831 A1 | 3/2009 | Enquist et al. |
| 2009/0227047 A1 | 9/2009 | Yang et al. |
| 2009/0273082 A1 | 11/2009 | Kim et al. |
| 2010/0009519 A1 | 1/2010 | Seddon et al. |
| 2010/0062611 A1 | 3/2010 | Liu et al. |
| 2010/0120227 A1 | 5/2010 | Grivna et al. |
| 2010/0120230 A1 | 5/2010 | Grivna et al. |
| 2010/0144069 A1 | 6/2010 | Johnson |
| 2010/0210078 A1 | 8/2010 | Miyairi et al. |
| 2010/0255682 A1 | 10/2010 | Trickett et al. |
| 2011/0037142 A1 | 2/2011 | Huang |
| 2011/0081749 A1 | 4/2011 | Chiou et al. |
| 2011/0136267 A1 | 6/2011 | Morita et al. |
| 2011/0198721 A1 | 8/2011 | Yang et al. |
| 2011/0244601 A1 | 10/2011 | Gaillard et al. |
| 2011/0250733 A1 | 10/2011 | Lempinen et al. |
| 2011/0256728 A1 | 10/2011 | Hiroe et al. |
| 2011/0312138 A1 | 12/2011 | Yedinak et al. |
| 2011/0312166 A1 | 12/2011 | Yedinak et al. |
| 2012/0058623 A1 | 3/2012 | Hsieh et al. |
| 2012/0083095 A1 | 4/2012 | Chew et al. |
| 2012/0149134 A1 | 6/2012 | Johnson et al. |
| 2012/0168947 A1 | 7/2012 | Kim et al. |
| 2012/0220091 A1 | 8/2012 | Challa et al. |
| 2012/0302063 A1 | 11/2012 | Markham et al. |
| 2013/0034918 A1 | 2/2013 | Dusemund et al. |
| 2013/0178062 A1 | 7/2013 | Enquist et al. |
| 2013/0210172 A1 | 8/2013 | Chen et al. |
| 2013/0267049 A1 | 10/2013 | Robert et al. |
| 2013/0271174 A1 | 10/2013 | Johnson |
| 2013/0328174 A1 | 12/2013 | La Tulipe et al. |
| 2014/0028340 A1 | 1/2014 | Graf et al. |
| 2014/0113390 A1 | 4/2014 | Ploessl et al. |
| 2014/0187040 A1 | 7/2014 | Enquist et al. |
| 2015/0108612 A1 | 4/2015 | Numaguchi et al. |
| 2015/0179544 A1 | 6/2015 | Chockanathan et al. |
| 2015/0206809 A1 | 7/2015 | Ding et al. |
| 2015/0279740 A1 | 10/2015 | Roesner et al. |
| 2015/0293171 A1 | 10/2015 | Johnson |
| 2015/0325562 A1 | 11/2015 | Haba et al. |
| 2015/0340285 A1 | 11/2015 | Enquist et al. |
| 2015/0357254 A1 | 12/2015 | Mikami et al. |
| 2016/0071733 A1 | 3/2016 | Ono et al. |
| 2016/0096767 A1 | 4/2016 | Markham et al. |
| 2016/0118436 A1 | 4/2016 | Fujii et al. |
| 2016/0254579 A1 | 9/2016 | Mills |
| 2016/0276163 A1 | 9/2016 | Leobandung et al. |
| 2017/0110329 A1 | 4/2017 | Carmelo et al. |
| 2017/0158888 A1 | 6/2017 | Kang et al. |
| 2017/0207097 A1 | 7/2017 | Leobandung et al. |
| 2017/0217756 A1 | 8/2017 | Hsieh et al. |
| 2017/0316971 A1 | 11/2017 | Enquist et al. |
| 2018/0019139 A1 | 1/2018 | Sun et al. |
| 2018/0040469 A1 | 2/2018 | Seddon |
| 2018/0061710 A1 | 3/2018 | Oshige et al. |
| 2018/0144974 A1 | 5/2018 | Hellmund et al. |
| 2018/0254221 A1 | 9/2018 | Mauer et al. |
| 2018/0265819 A1 | 9/2018 | Kanq et al. |
| 2018/0286782 A1 | 10/2018 | Noda et al. |
| 2019/0006169 A1 | 1/2019 | Seddon |
| 2019/0043814 A1 | 2/2019 | Marzaki et al. |
| 2019/0043883 A1 | 2/2019 | Xu et al. |
| 2020/0098618 A1* | 3/2020 | Tsai ............... H01L 21/76256 |

OTHER PUBLICATIONS

U.S. Appl. No. 15/892,648, filed Feb. 9, 2018, Sandisk Technologies LLC.
U.S. Appl. No. 15/928,340, filed Mar. 22, 2018, Sandisk Technologies LLC.
U.S. Appl. No. 15/928,407, filed Mar. 22, 2018, Sandisk Technologies LLC.
U.S. Appl. No. 15/960,267, filed Apr. 23, 2018, Sandisk Technologies LLC.
U.S. Appl. No. 15/979,885, filed May 15, 2018, Sandisk Technologies LLC.
U.S. Appl. No. 16/231,752, filed Dec. 24, 2018, Sandisk Technologies LLC.
U.S. Appl. No. 16/242,216, filed Jan. 8, 2019, Sandisk Technologies LLC.
U.S. Appl. No. 16/243,469, filed Jan. 9, 2019, Sandisk Technologies LLC.
U.S. Appl. No. 16/248,923, filed Jan. 16, 2019, Sandisk Technologies LLC
U.S. Appl. No. 16/249,423, filed Jan. 16, 2019, Sandisk Technologies LLC.
U.S. Appl. No. 16/255,413, filed Jan. 23, 2019, Sandisk Technologies LLC.
U.S. Appl. No. 16/269,301, filed Feb. 6, 2019, Sandisk Technologies LLC.
U.S. Appl. No. 16/274,687, filed Feb. 13, 2019, Sandisk Technologies LLC.
U.S. Appl. No. 16/275,668, filed Feb. 14, 2019, Sandisk Technologies LLC.
U.S. Appl. No. 16/278,372, filed Feb. 18, 2019, Sandisk Technologies LLC.
U.S. Appl. No. 16/284,502, filed Feb. 25, 2019, Sandisk Technologies LLC.
U.S. Appl. No. 16/288,656, filed Feb. 28, 2019, Sandisk Technologies LLC.
U.S. Appl. No. 16/291,457, filed Mar. 4, 2019, Sandisk Technologies LLC.

(56) References Cited

OTHER PUBLICATIONS

U.S. Appl. No. 16/291,504, filed Mar. 4, 2019, Sandisk Technologies LLC.
U.S. Appl. No. 16/291,577, filed Mar. 4, 2019, Sandisk Technologies LLC.
U.S. Appl. No. 16/295,292, filed Mar. 7, 2019, Sandisk Technologies LLC.
U.S. Appl. No. 16/372,908, filed Apr. 2, 2019, Sandisk Technologies LLC.
U.S. Appl. No. 16/385,010, filed Apr. 16, 2019, Sandisk Technologies LLC.
U.S. Appl. No. 16/417,913, filed May 21, 2019, Sandisk Technologies LLC.
Notification of Transmittal of the International Search Report and Written Opinion of the International Search Authority International Patent Application No. PCT/US2019/068672, dated Mar. 26, 2020, 8 pages.

* cited by examiner

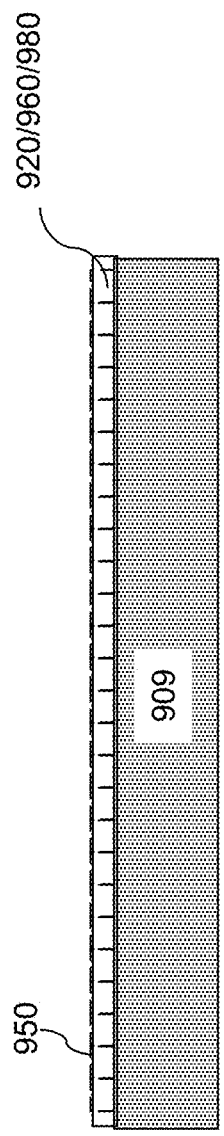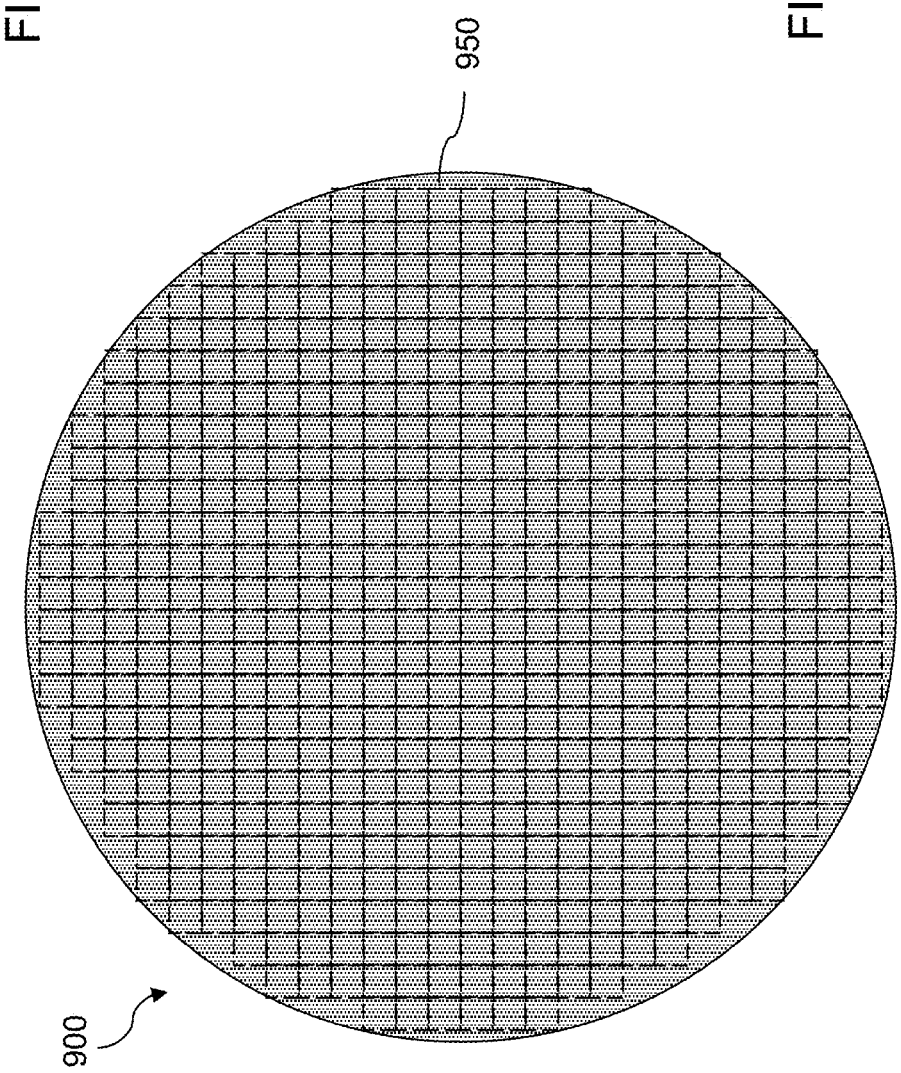
FIG. 1B
FIG. 1C

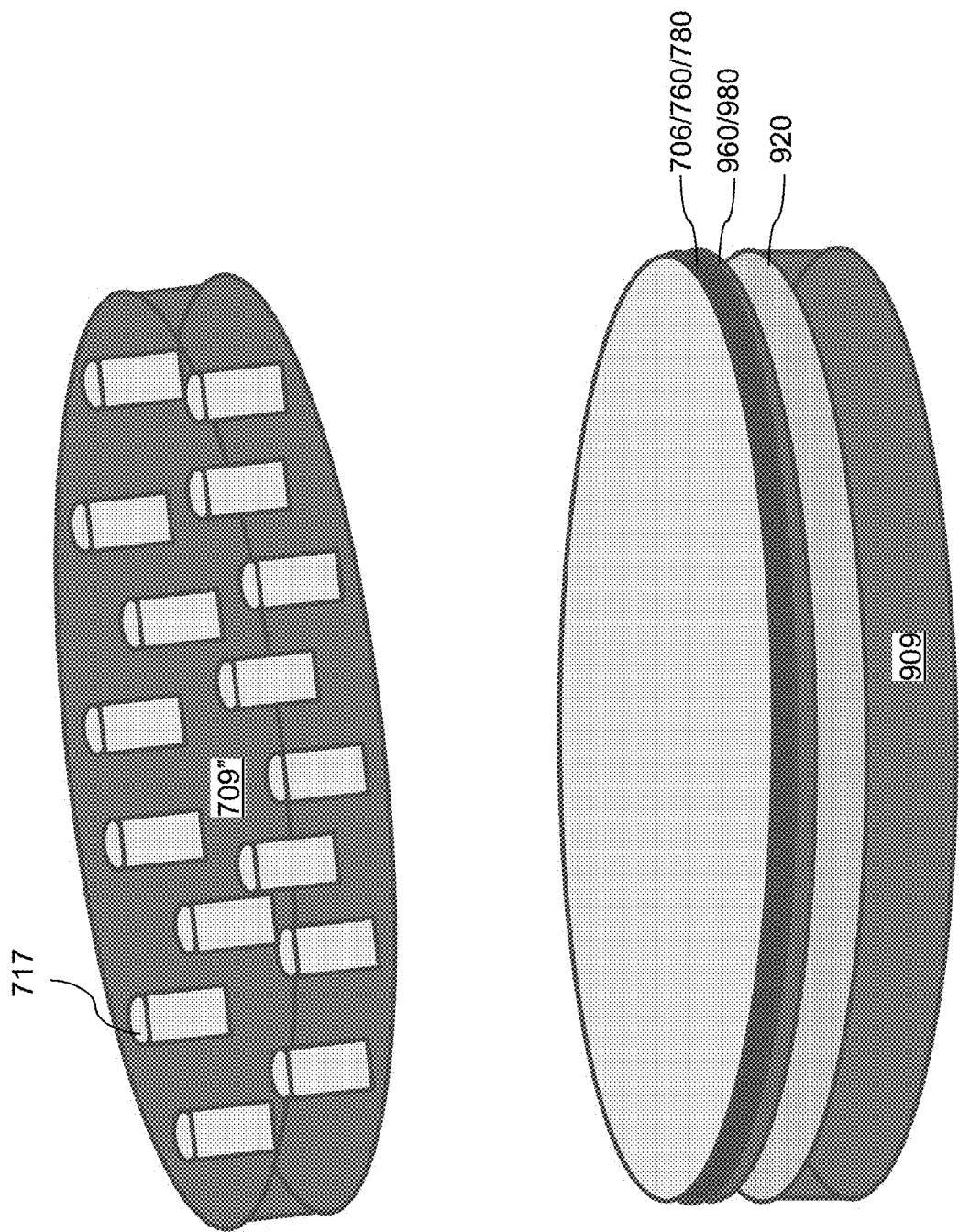

METHOD FOR REMOVING A BULK SUBSTRATE FROM A BONDED ASSEMBLY OF WAFERS

FIELD

The present disclosure relates generally to the field of semiconductor devices, and in particular, to a method for removing a bulk substrate from a bonded assembly of wafers.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a semiconductor structure comprises providing a first wafer including a first substrate, first semiconductor devices overlying the first substrate, and first dielectric material layers and first metal bonding pads overlying the first semiconductor devices, forming a sacrificial material layer over a top surface of a second wafer including a second substrate, forming second semiconductor devices, second dielectric material layers and second metal bonding pads over a top surface of the sacrificial material layer, attaching the second wafer to the first wafer such that the second dielectric material layers face the first dielectric material layers, and the first bonding pads are bonded to the second bonding pads, forming a plurality of voids through the second substrate such that surfaces of the sacrificial material layer are physically exposed underneath the plurality of voids, and removing the sacrificial material layer by providing an etchant that etches a material of the sacrificial material layer through the plurality of voids, wherein the second substrate is detached from a bonded assembly including the first wafer, the second semiconductor devices, the second bonding pads, and the second dielectric material layers upon removal of the sacrificial material layer.

BRIEF DESCRIPTION OF THE DRAWINGS

FIG. 1B is a vertical cross-sectional view of the first wafer that may include a plurality of the first die of FIG. 1A according to an embodiment of the present disclosure.

FIG. 1C is a top-down view of the first wafer of FIG. 1B.

FIG. 8 is a perspective view of the second configuration of the bonded assembly after removing a sacrificial material layer and detaching substrate material strips derived from the second substrate according to the second embodiment of the present disclosure.

DETAILED DESCRIPTION

Figure 1A:
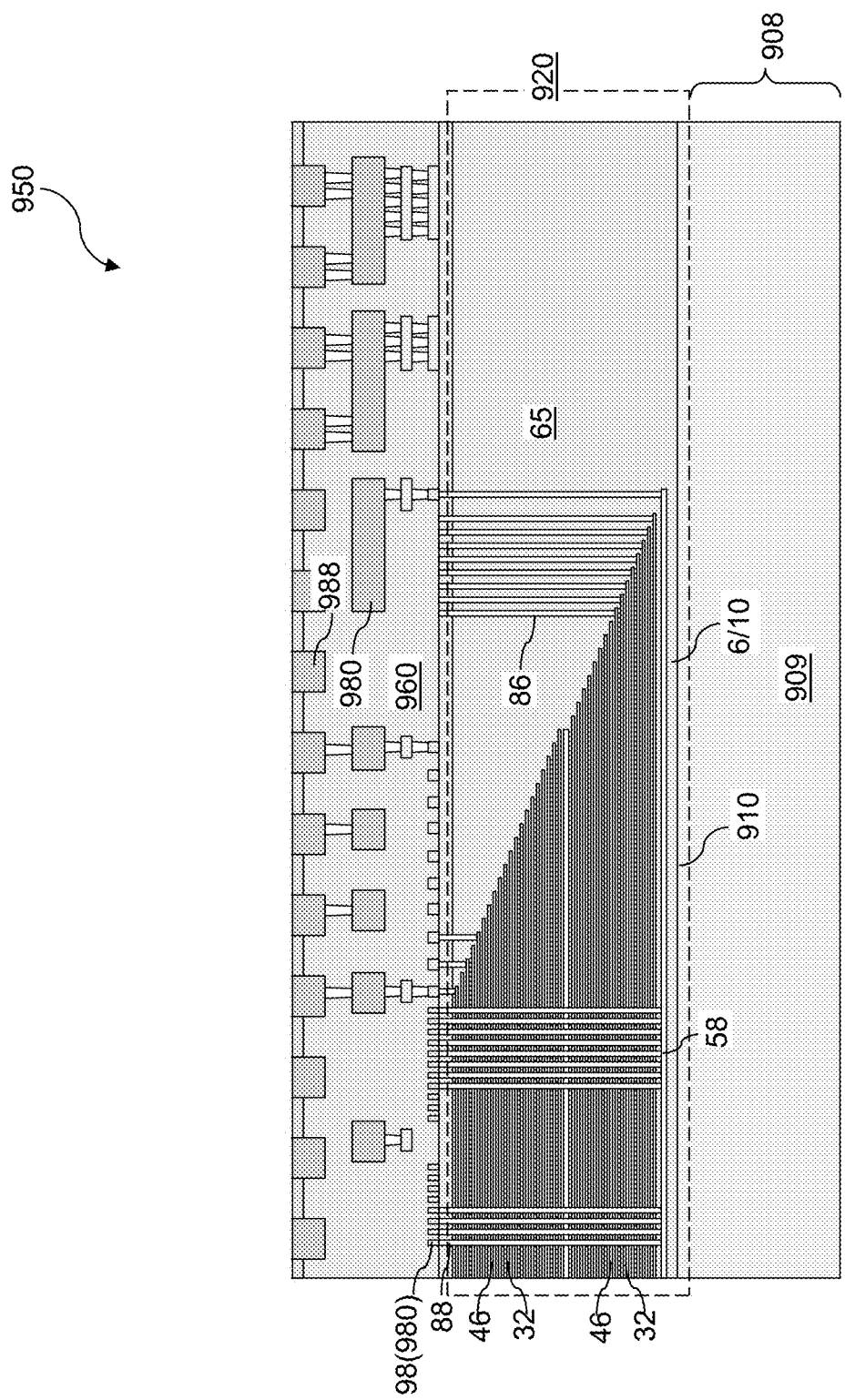
FIG. 1A is a vertical cross-sectional view of a first die that may be provided in a first wafer according to an embodiment of the present disclosure.

High performance semiconductor chips may be provided by using a wafer bonding between a first wafer including memory dies and a second wafer including support dies, which are dies including logic devices configured to operate a respective one of the memory dies. In such instances where the first wafer is bonded to the second wafer, a bulk substrate of one of the two wafers needs to be removed to provide a thinner layer through which substrate contact via structures are subsequently formed. Grinding is typically used to thin the bulk substrate. However, grinding typically involves the removal of a thick layer of a substrate material, which may have a thickness in a range from 500 microns to 1 mm. As such, grinding is time-consuming, costly, and generates fine particles that are difficult to remove and manage. A more economical method for removing a bulk substrate from a bonded assembly of two wafers is thus desired.

As discussed above, the present disclosure is directed to a method for removing a bulk substrate from a bonded assembly of wafers, the various embodiments of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1C, a first wafer 900 including a two-dimensional array of first semiconductor dies 950 is illustrated. The first wafer 900 may be formed by providing a first substrate 908, and by forming first semiconductor devices 920, first dielectric material layers 960, and first metal interconnect structures 980 formed in the first dielectric material layers 960. The first substrate 908 may have a thickness in a range from 300 microns to 2,000 microns, although lesser and greater thicknesses may also be used. In one embodiment, the first substrate 908 may include a commercially available semiconductor substrate.

The first substrate 908 may include a first substrate semiconductor layer 909, which may be the entirety of the first substrate 908 or a top portion of the first substrate 908. In one embodiment, the first semiconductor devices 920 may include a three-dimensional array of memory elements such as a three-dimensional NAND memory array. Alternatively, the first semiconductor devices 920 may include a peripheral circuitry configured to control operation of a three-dimensional array of memory elements to be provided in another semiconductor die.

In an illustrative example, the first semiconductor devices 920 may include a planar insulating spacer 910 located on a top surface of the first substrate semiconductor layer 909, at least one alternating stack of insulating layers 32 and electrically conductive layers 46, and memory stack structures 58 vertically extending through the at least one alternating stack (32, 46). Each memory stack structure 58 may include a memory film, a vertical semiconductor channel contacting the memory film, and a drain region contacting a top end of the vertical semiconductor channel. A retro-stepped dielectric material portion 65 may be located over stepped surfaces of the at least one alternating stack (32, 46). The first dielectric material layers 960 may be formed over the at least one alternating stack (32, 46) and the retro-stepped dielectric material portion 65. Various contact via structures (86, 88) may be formed to provide electrical contact to various nodes of the first semiconductor devices 920. For example, the various contact via structures (86, 88) may include word line contact via structures 86 contacting the electrically conductive layers 46, which may function as word lines for the three-dimensional array of memory elements located within the memory stack structures 58. The contact via structures (86, 88) may include drain contact via structures 88 contacting a respective one of the drain regions. The first metal interconnect structures 980 may include bit lines 98 that are connected to a respective subset of the drain contact via structures 88. First metal bonding pads 988 are formed within the first dielectric material layers 960 at a surface portion thereof. Each of the first semiconductor dies 950 may comprise a respective subset of the first semiconductor devices 920. Each first semiconductor die 950 may include a set of first metal bonding pads 988 that are physically exposed. Each of the first semiconductor dies 950 may include a memory die or a support die that may be bonded to a memory die.

Figure 2A:
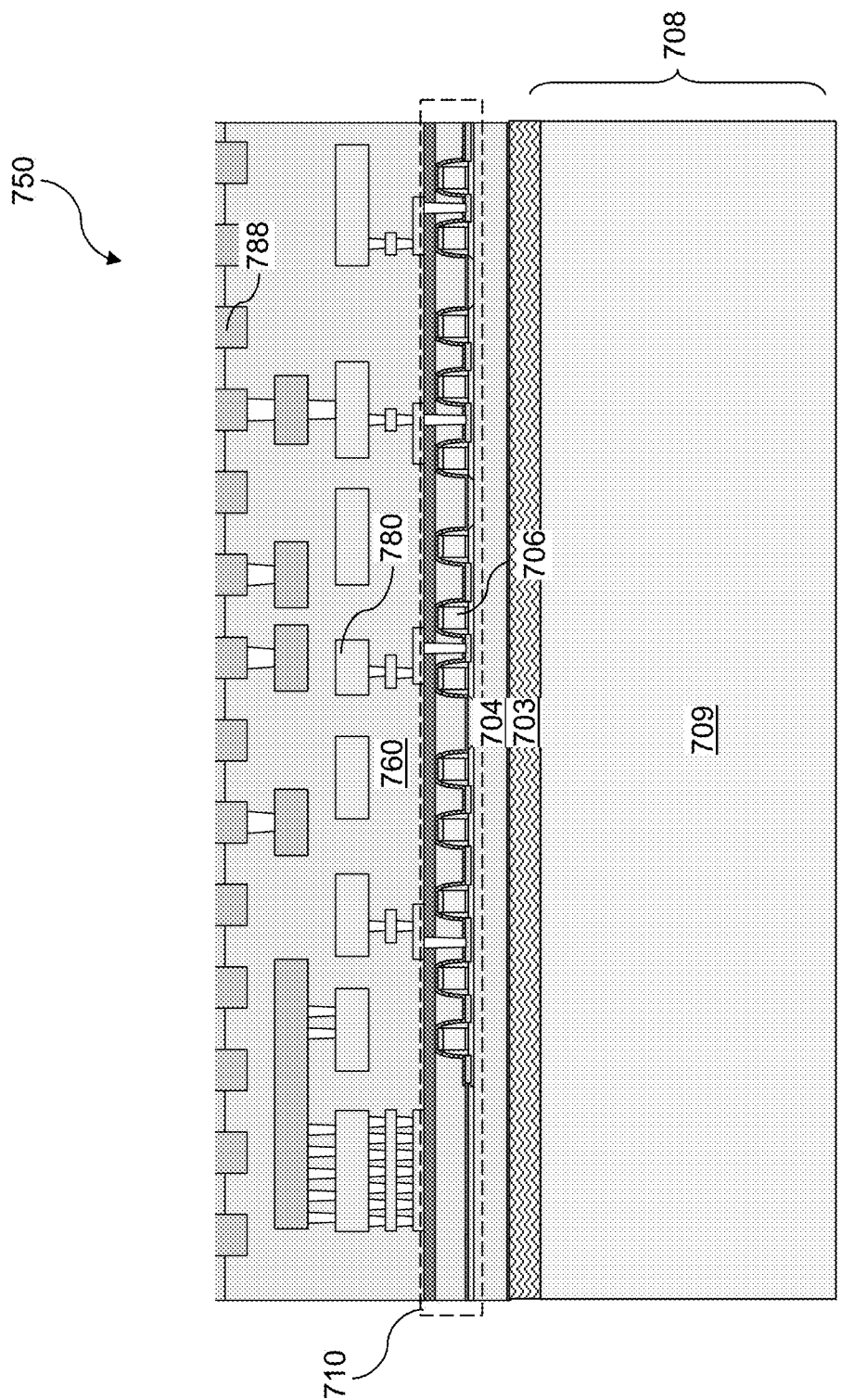
FIG. 2A is a vertical cross-sectional view of a second die that may be provided in a second wafer according to an embodiment of the present disclosure.
Figure 2B:
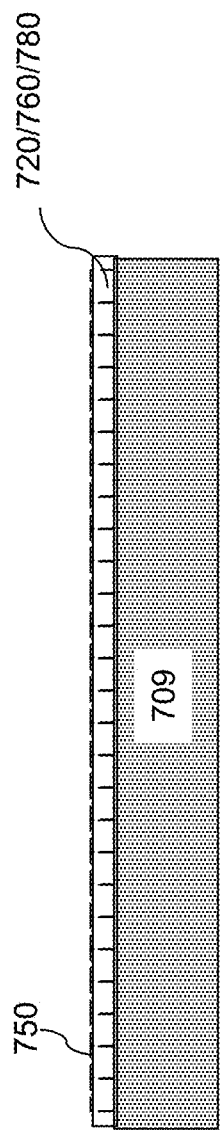
FIG. 2B is a vertical cross-sectional view of the second wafer that may include a plurality of the second die of FIG. 2A according to an embodiment of the present disclosure.
Figure 2C:
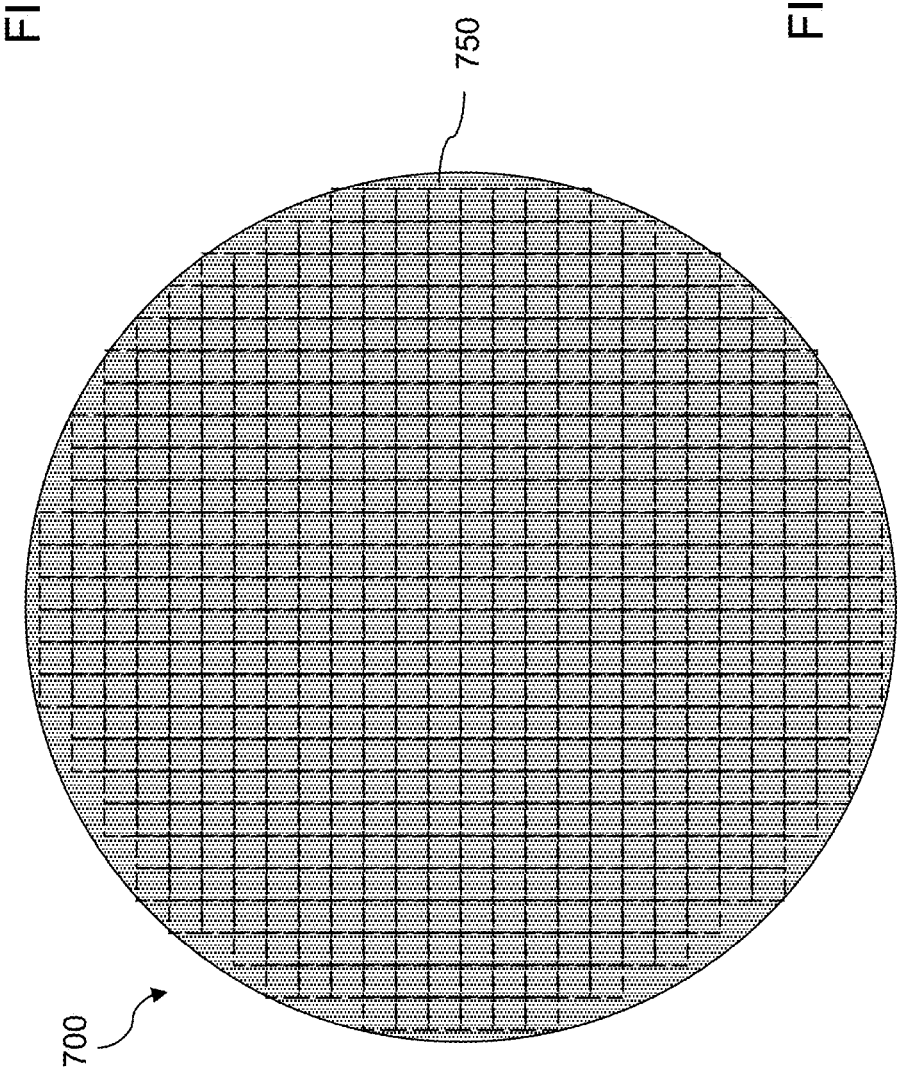
FIG. 2C is a top-down view of the second wafer of FIG. 2B.

Referring to FIGS. 2A-2C, a second wafer 700 including a two-dimensional array of second semiconductor dies 750 is illustrated. The second wafer 700 may be formed by providing a second substrate 708, and by forming second semiconductor devices 710, second dielectric material layers 760, and second metal interconnect structures 780 formed in the second dielectric material layers 760. The second substrate 708 may have a thickness in a range from 300 microns to 2,000 microns, although lesser and greater thicknesses may also be used. In one embodiment, the second substrate 708 may include a commercially available semiconductor substrate. The second substrate 708 may include a second substrate semiconductor layer 709, which may be the entirety of the second substrate 708 or a top portion of the second substrate 708.

A sacrificial material layer 703 may be formed over a top surface of the second substrate 708. The sacrificial material layer 703 may include a material that may be subsequently removed selective to the material of the second substrate semiconductor layer 709. For example, if the second substrate semiconductor layer 709 includes single crystalline silicon, the sacrificial material layer 703 may include silicon nitride, a silico-germanium alloy, or borosilicate glass. The sacrificial material layer 703 may have a thickness in a range from 100 nm to 5,000 nm. The sacrificial material layer 703 may be deposited by a conformal deposition process or a non-conformal deposition process.

An etch barrier layer 704 may be optionally formed on a top surface of the sacrificial material layer 703. The etch barrier layer 704 may include a material that is resistant to an etchant to be subsequently used to remove the sacrificial material layer 703. For example, the etch barrier layer 704 may include silicon oxide or a dielectric metal oxide material such as aluminum oxide. The thickness of the etch barrier layer 704 may be in a range from 50 nm to 500 nm, although lesser and greater thicknesses may also be used. In one embodiment, the etch barrier layer 704 may include a silicon oxide layer, which is herein referred to as a first silicon oxide layer.

A semiconductor material layer 706 may be formed over the sacrificial material layer 703. The semiconductor material layer 706 may be formed directly on a top surface of the etch barrier layer 704, or may be formed directly on a top surface of the sacrificial material layer 703 in case the etch barrier layer 704 is not used.

In one embodiment, the semiconductor material layer 706 may be formed by providing a single crystalline semiconductor wafer having a second silicon oxide layer on a top portion thereof. A hydrogen implanted layer may be formed within the single crystalline semiconductor wafer by implanting hydrogen atoms through the second silicon oxide layer. The depth of the hydrogen implanted layer may be in a range from 50 nm to 1,000 nm from the interface between the single crystalline semiconductor wafer and the second silicon oxide layer. The second silicon oxide layer may be bonded to the first silicon oxide layer by oxide-to-oxide bonding, which may use a thermal anneal at an elevated temperature that may be in a range from 400 degrees Celsius to 1,000 degrees Celsius. The single crystalline semiconductor wafer may include a proximal portion that is more proximal to the bonding interface than the hydrogen implanted layer is to the bonding interface, and a distal portion that is more distal from the bonding interface than the hydrogen implanted layer is from the bonding interface. The single crystalline semiconductor wafer may be cleaved at the hydrogen implanted layer during, or after, bonding the proximal portion of the single crystalline semiconductor layer to the first silicon oxide layer though the second silicon oxide layer. The distal portion of the single crystalline semiconductor layer is cleaved from the proximal portion of the single crystalline semiconductor layer. The proximal portion of the single crystalline semiconductor layer that is attached to the second silicon oxide layer constitutes the semiconductor material layer 706. In this case, the semiconductor material layer 706 may include a single crystalline semiconductor material.

In another embodiment, the semiconductor material layer 706 may comprise a polycrystalline semiconductor material layer. In this case, the semiconductor material layer 706 may be formed by deposition of a polycrystalline semiconductor material on a top surface of the etch barrier layer 704 (or on a top surface of the sacrificial material layer 703) or by deposition of an amorphous semiconductor material on the top surface of the etch barrier layer 704 (or on a top surface of the sacrificial material layer 703) and a subsequent thermal anneal process that converts the amorphous semiconductor material into a polycrystalline semiconductor material. The semiconductor material of the semiconductor material layer 706 may be deposited, for example, by chemical vapor deposition. The thickness of the semiconductor material layer 706 may be in a range from 50 nm to 1,000 nm, although lesser and greater thicknesses may also be used.

Second semiconductor devices 710 and second dielectric material layers 760 may be formed over a top surface of the sacrificial material layer 703. The second semiconductor devices 710 and second dielectric material layers 760 may be formed on a top surface of the semiconductor material layer 706. The second metal interconnect structures 780 may be formed in the second dielectric material layer 760. The second metal interconnect structures 780 may provide electrical interconnection to the various nodes of the second semiconductor devices 710. Second metal bonding pads 788 are formed within the second dielectric material layers 760 at a surface portion thereof.

A plurality of second semiconductor dies 750 may be formed on the second wafer 700. Each of the second semiconductor dies 750 may comprise a respective subset of the second semiconductor devices 710. Each of the second semiconductor dies 750 may include a memory die or a support die that may be bonded to a memory die. Each second semiconductor die 750 may include a set of second metal bonding pads 788 that are physically exposed. The set of second metal bonding pads 788 may have a mirror image pattern of the pattern of a set of first metal bonding pads 988 on each first semiconductor die 950.

In one embodiment, the first semiconductor devices 920 on the first wafer 900 may comprise a three-dimensional array of memory elements, and the second semiconductor devices 710 on the second wafer 700 may comprise a peripheral circuitry configured to control operation of the three-dimensional array of memory elements. In another embodiment, the second semiconductor devices 710 of the second wafer 700 may comprise a three-dimensional array of memory elements, and the first semiconductor devices 920 of the first wafer 900 may comprise a peripheral circuitry configured to control operation of the three-dimensional array of memory elements.

Figure 3:
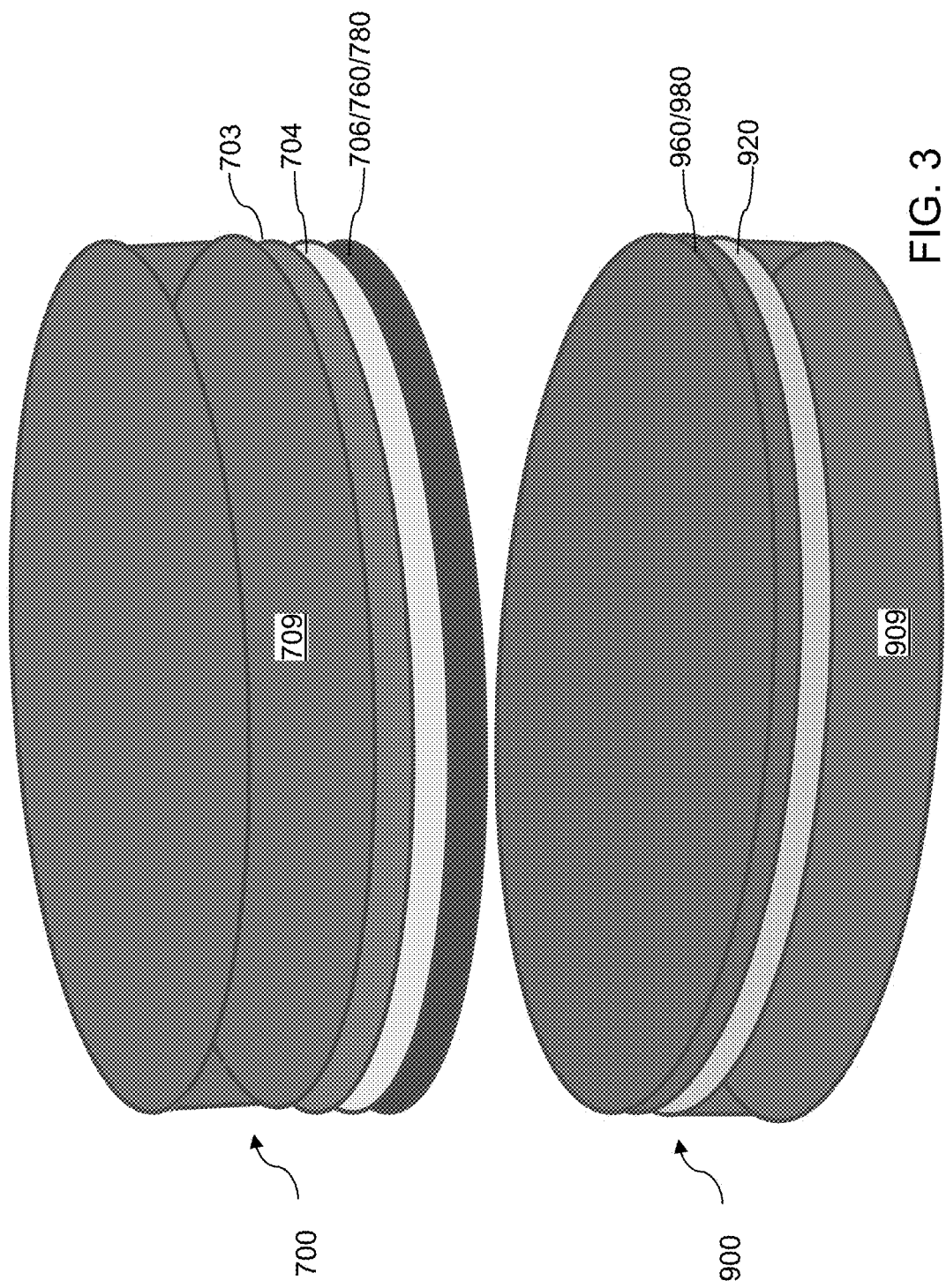
FIG. 3 is a perspective view of an exemplary structure including the first wafer and the second wafer prior to bonding the second substrate to the first substrate according to an embodiment of the present disclosure.

Referring to FIG. 3, the first wafer 900 and the second wafer 700 may be positioned and orientated such that the physically exposed surface of the first dielectric material layers 960 of the first wafer 900 faces the physically exposed surface of the second dielectric material layers 760 of the second wafer 700. The first wafer 900 and the second wafer 700 may be oriented such that each set of first metal bonding pads 988 on a first semiconductor die 950 faces a respective set of second metal bonding pads 788 on a second semiconductor die 750.

Figure 4:
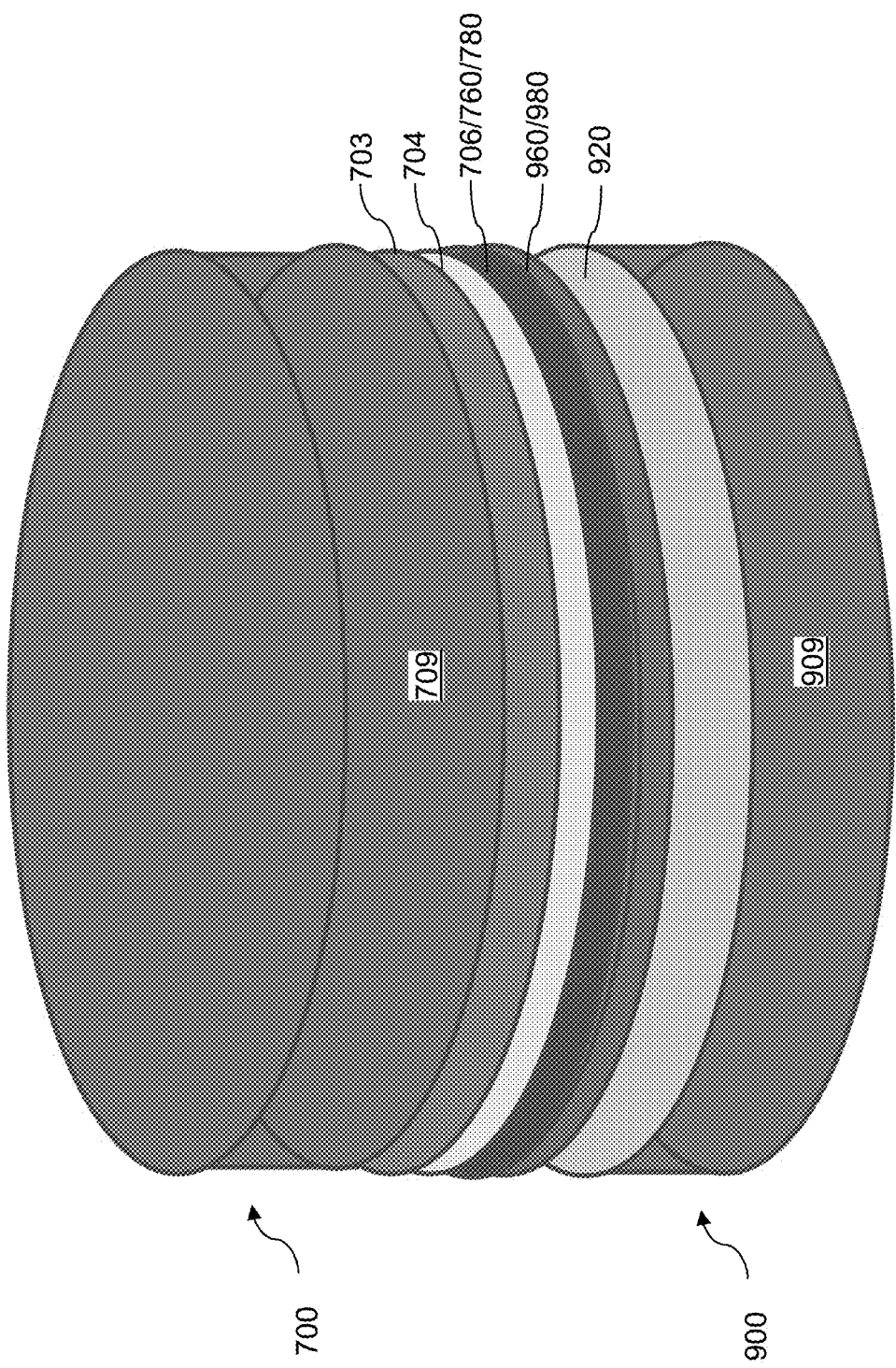
FIG. 4 is a perspective view of an exemplary structure including a bonded assembly of the first wafer and the second wafer after bonding the second substrate to the first substrate according to an embodiment of the present disclosure.

Referring to FIG. 4, each set of first metal bonding pads 988 of the first semiconductor die 950 may be bonded to a respective set of second metal bonding pads 788 of the second semiconductor die 750 by metal-to-metal bonding such as copper-to-copper bonding. The second wafer 700 may be attached to the first wafer 900 to form a bonded assembly (900, 700) such that the second dielectric material layers 760 face the first dielectric material layers 960.

Figure 5A:
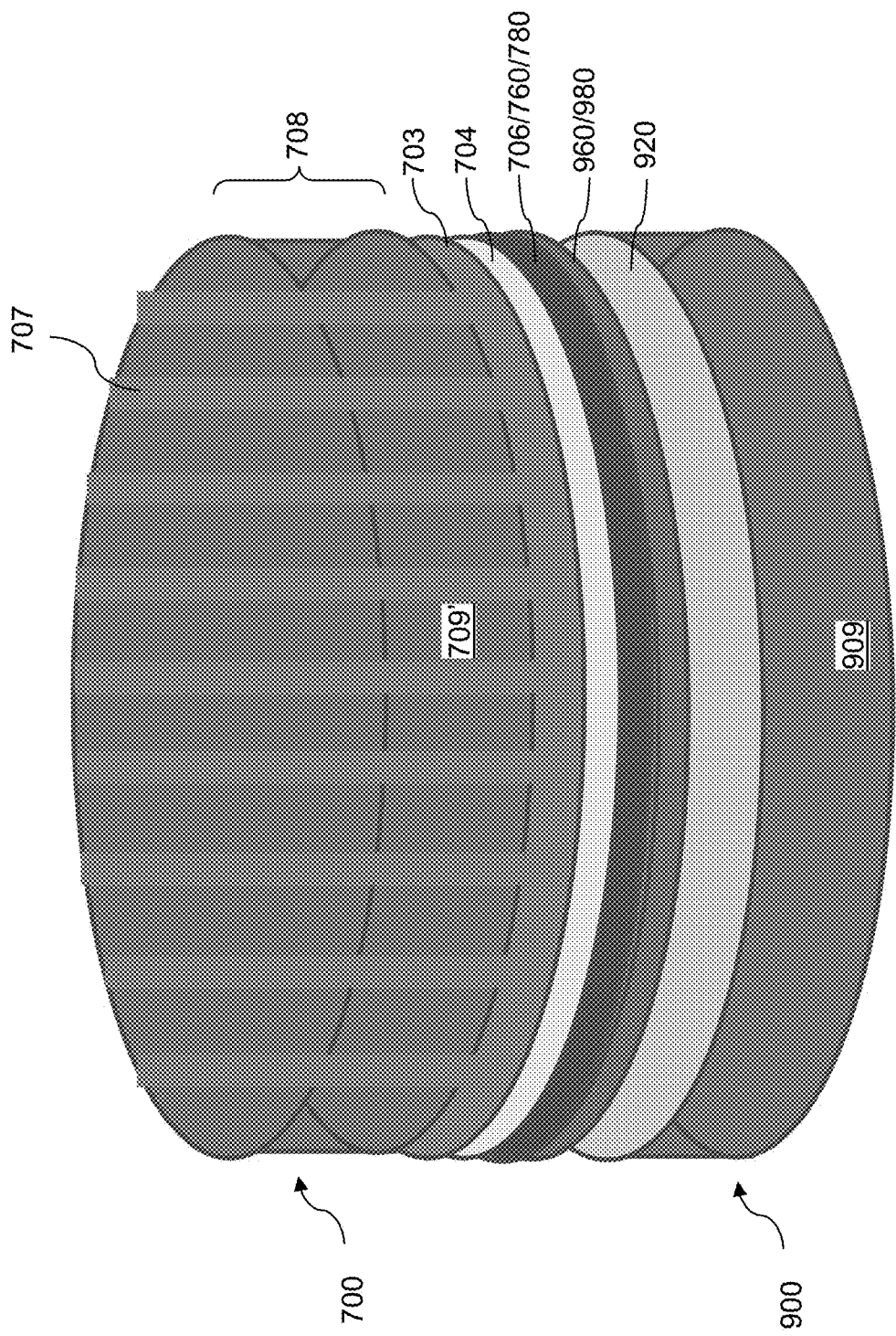
FIG. 5A is a perspective view of a first configuration of the bonded assembly after forming trenches as voids that extend through a second substrate of the wafer according to a first embodiment of the present disclosure.
Figure 5B:
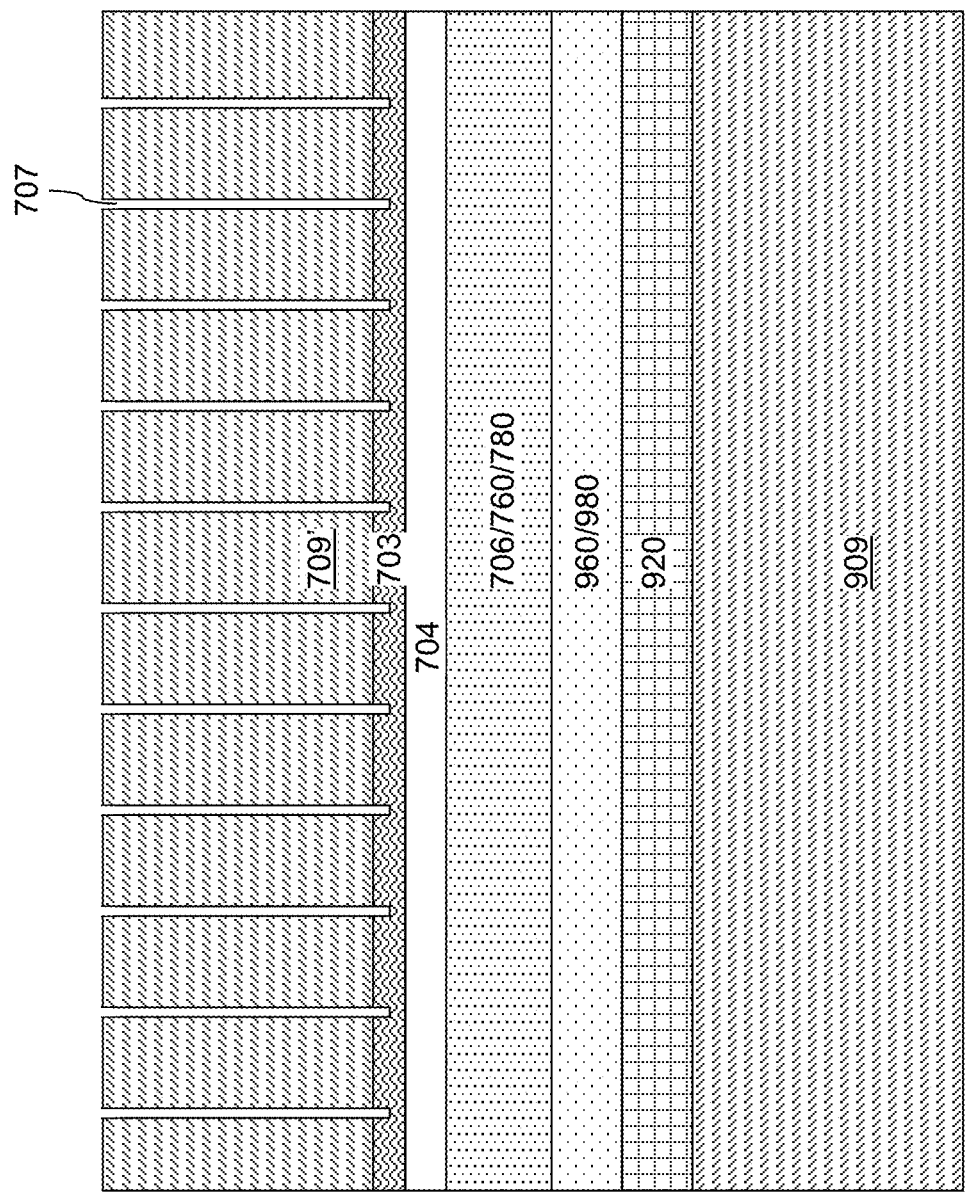
FIG. 5B is a vertical cross-sectional view of the first configuration of the bonded assembly of FIG. 5A.
Figure 5C:
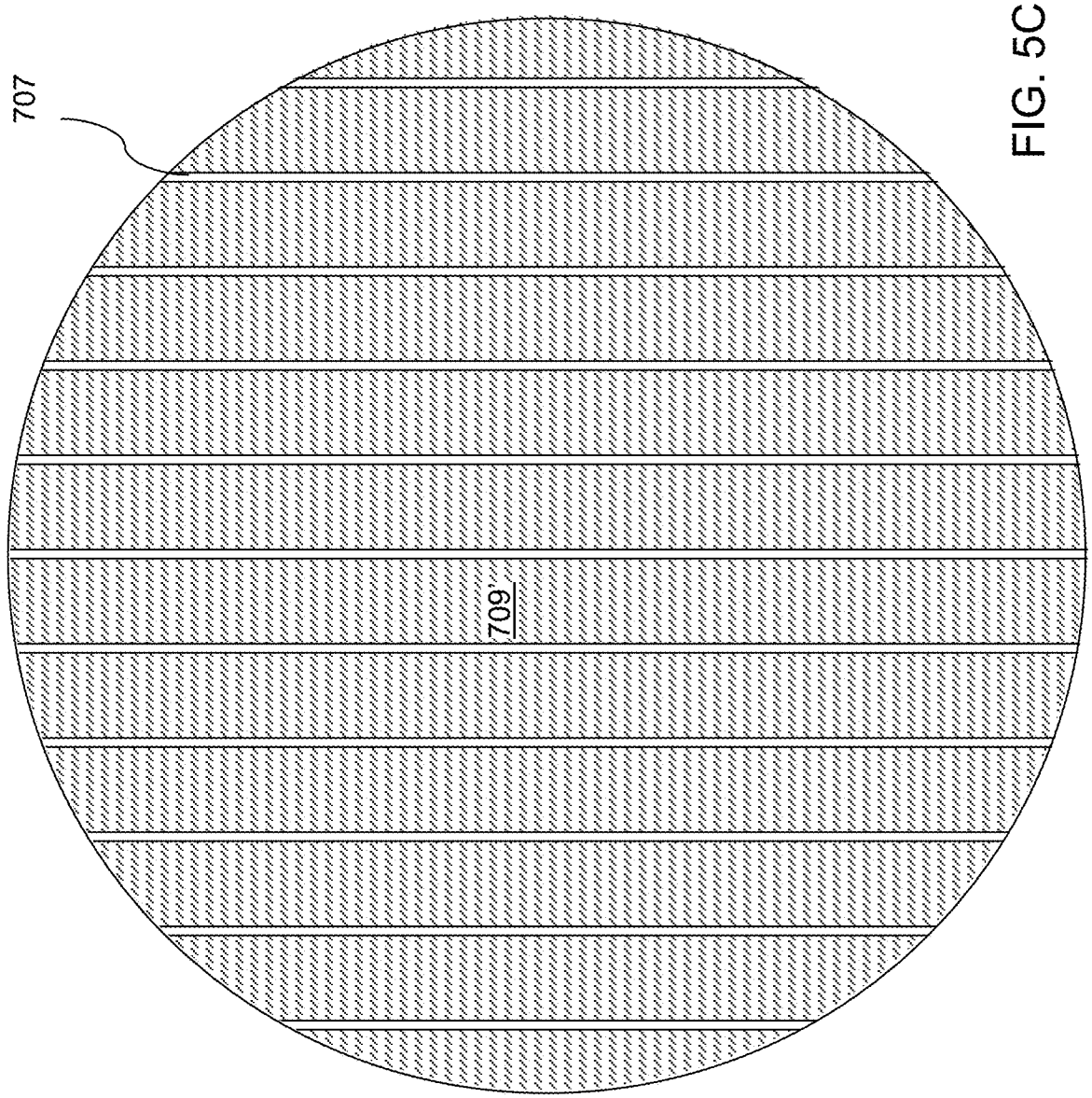
FIG. 5C is a top-down view of the first configuration of the bonded assembly of FIGS. 5A and 5B.

Referring to FIGS. 5A-5C, a first configuration of the bonded assembly that may be used to remove the second substrate 708 is illustrated. A plurality of voids may be formed through the second substrate 708 such that surfaces of the sacrificial material layer 703 are physically exposed underneath the plurality of voids. In one embodiment, the maximum lateral distance between each neighboring pair of voids selected from the plurality of voids may be in a range from 1 mm to 25 mm.

In one embodiment, the plurality of voids may be formed as a plurality of trenches 707 having a respective pair of straight edges that laterally extend from one side of a periphery of the second substrate 708 to another side of the periphery of the second substrate 708. Each trench 707 may vertically extend through the entire thickness of the second substrate 708, and may have a uniform width throughout. In one embodiment, the straight edges of the plurality of trenches 707 may be substantially vertical and may be parallel to one another.

In one embodiment, the plurality of trenches 707 may be formed by dicing through the second substrate 708. In this case, the plurality of trenches 707 may be formed by dicing the second substrate 708 into multiple disjoined substrate material strips 709' using a dicing saw. A horizontal surface and a pair of sidewalls of the sacrificial material layer 703 may be physically exposed within each trench 707. The width of each trench 707 may be the same as the width of the blade of the dicing saw, and may be in a range from 50 microns to 2 mm, although lesser and greater widths may also be used.

In another embodiment, the plurality of trenches 707 may be formed by placing the assembly of the first wafer 900 and the second wafer 700 such that the second wafer 700 overlies the first wafer 900, by covering a top surface of the second wafer 700 with a patterned etch mask layer (such as a lithographically patterned photoresist layer) including line-shaped openings, and by transferring a pattern of the line-shaped openings through the second substrate 708 using an etch process. The etch process may use a dry etch process (such as an anisotropic etch process) or a wet etch process. For example, a wet etch process using a KOH solution may be used to form the plurality of trenches 707. In this case, the plurality of trenches 707 may have tapered sidewalls or contoured sidewalls with a taper angle in a range from 20 degrees to 70 degrees. The width of each trench 707 may be in a range from 50 microns to 2 mm, although lesser and greater widths may also be used.

Figure 6:
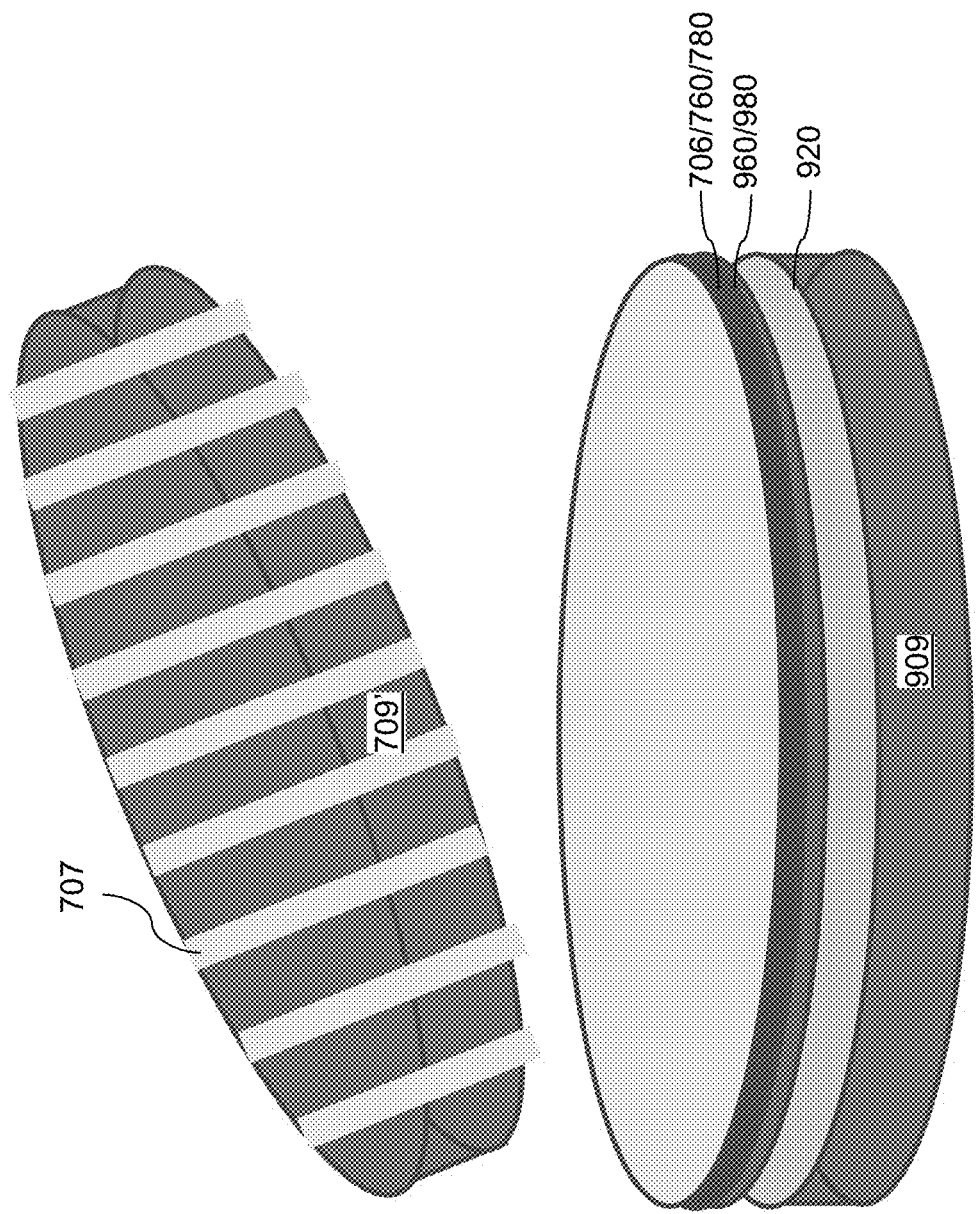
FIG. 6 is a perspective view of the first configuration of the bonded assembly after removing a sacrificial material layer and detaching substrate material strips derived from the second substrate according to the first embodiment of the present disclosure.

Referring to FIG. 6, an isotropic etch process may be performed to apply an isotropic etchant that etches the material of the sacrificial material layer 703 into the plurality of voids through the second substrate 708, i.e., into the plurality of trenches 707. In one embodiment, the isotropic etchant may be provided into the plurality of voids as a wet etch chemical in a wet etch process. For example, if the sacrificial material layer 703 includes silicon nitride, the isotropic etchant may include hot phosphoric acid. The isotropic etchant may etch the material of the sacrificial material layer 703 selective to the material of the etch barrier layer 704. The sacrificial material layer 703 may be removed by the isotropic etch process, and the disjoined substrate material strips 709' derived from the second substrate 708 may be detached from the remaining portions of the bonded assembly including the first wafer 900, the second semiconductor devices 710, and the second dielectric material layers 760 upon removal of the sacrificial material layer 703.

Figure 7A:
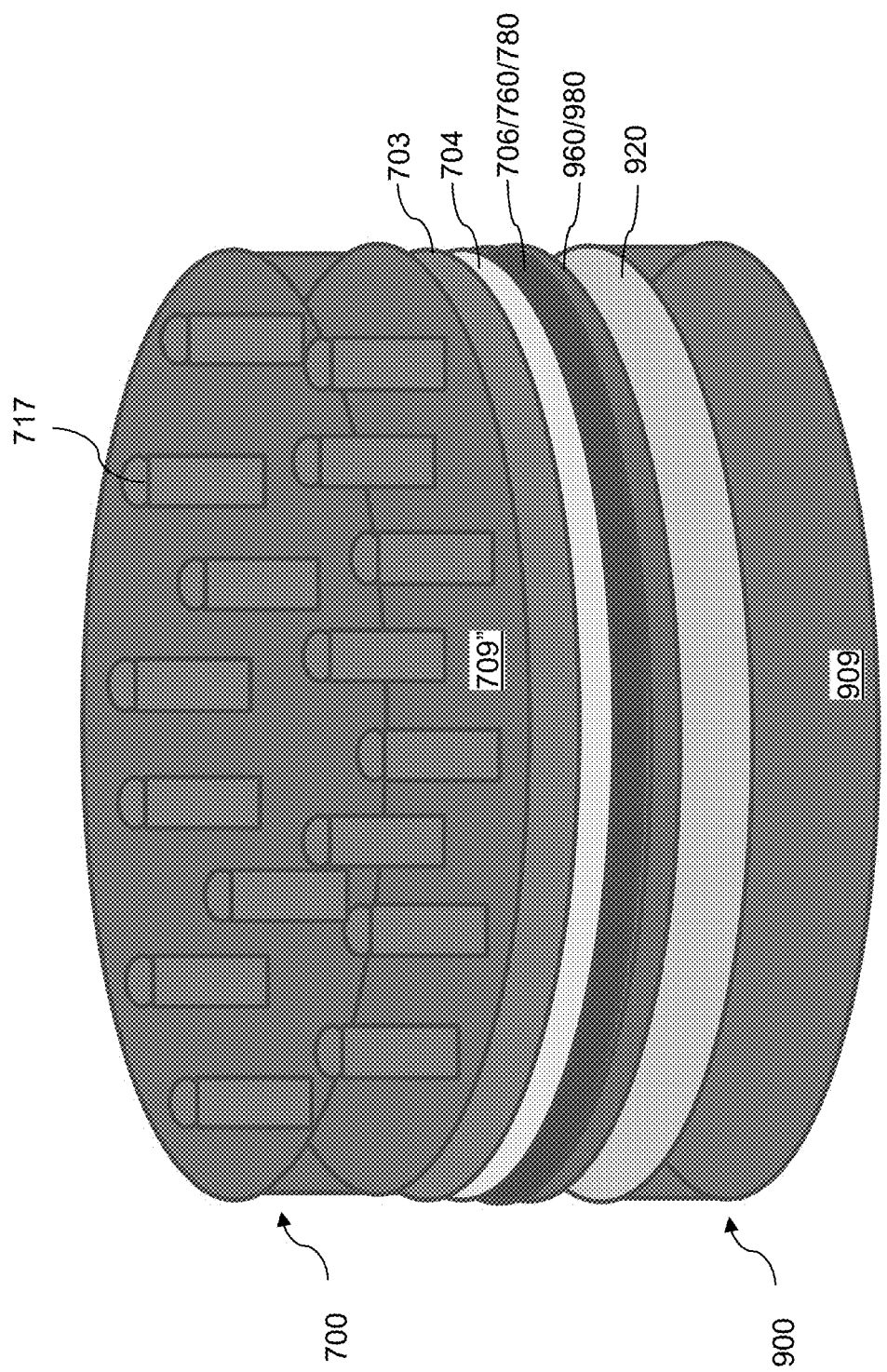
FIG. 7A is a perspective view of a second configuration of the bonded assembly after forming trenches as voids that extend through a second substrate of the wafer according to a second embodiment of the present disclosure.
Figure 7B:
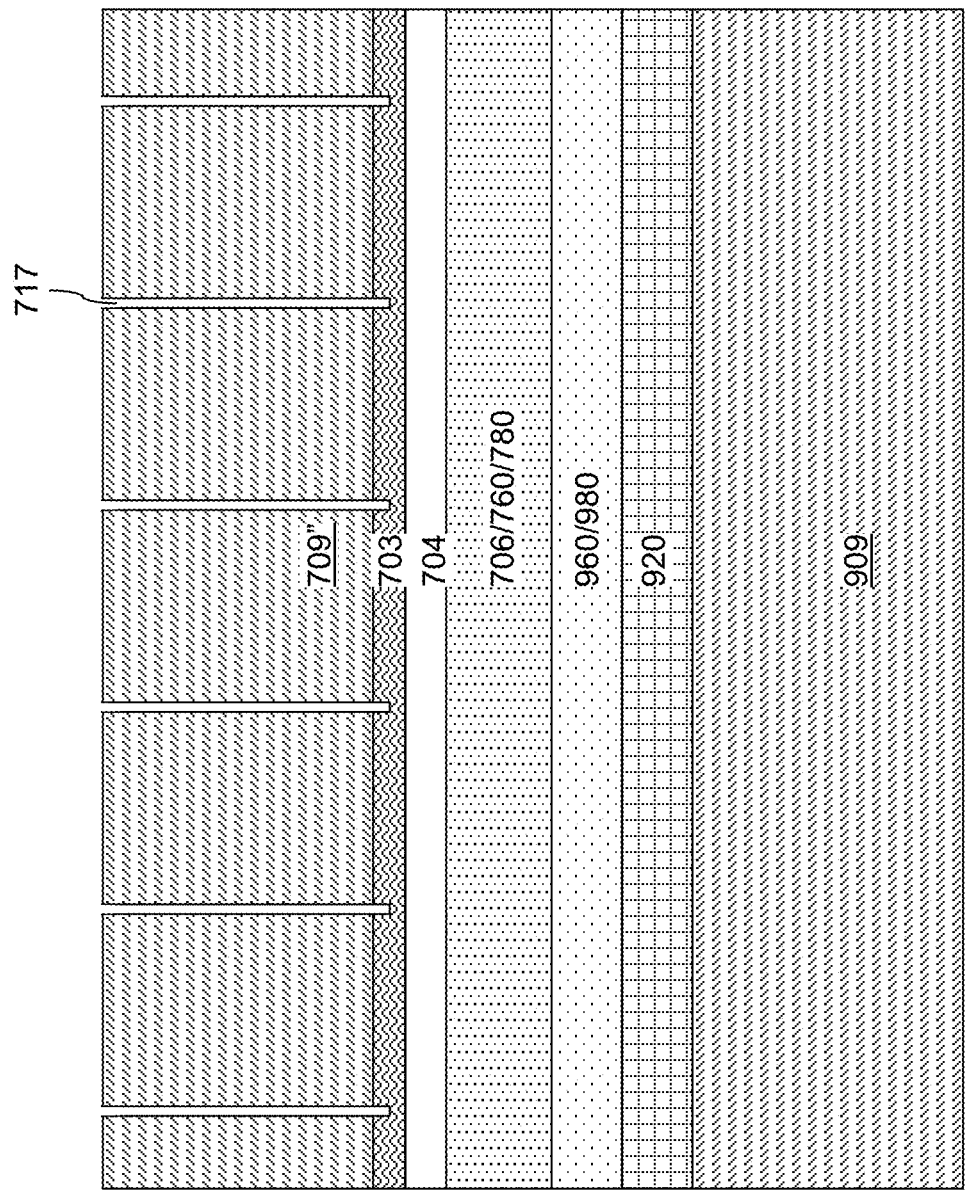
FIG. 7B is a vertical cross-sectional view of the second configuration of the bonded assembly of FIG. 7A.
Figure 7C:
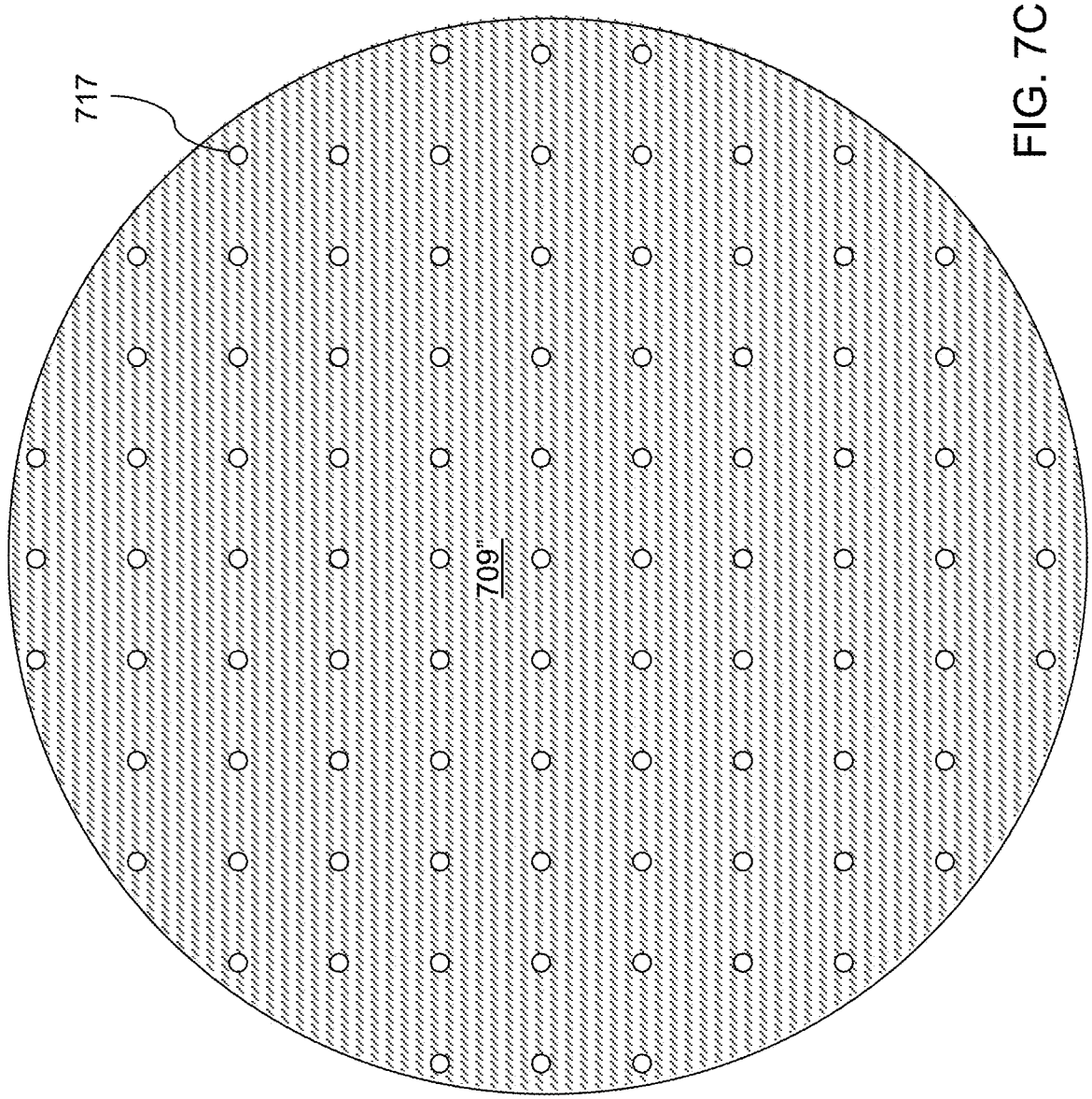
FIG. 7C is a top-down view of the second configuration of the bonded assembly of FIGS. 7A and 7B.

Referring to FIGS. 7A-7C, a second embodiment configuration of the bonded assembly that may be used to remove the second substrate 708 is illustrated. A plurality of voids may be formed through the second substrate 708 such that surfaces of the sacrificial material layer 703 may be physically exposed underneath the plurality of voids. In one embodiment, the maximum lateral distance between each neighboring pair of voids selected from the plurality of voids may be in a range from 1 mm to 25 mm.

In such an embodiment, the plurality of voids may be formed as a plurality of pillar-shaped discrete cavities 717 that are laterally spaced apart from one another. In one embodiment, the plurality of pillar-shaped discrete cavities 717 may be formed as a periodic two-dimensional array of pillar-shaped discrete cavities 717. Each pillar-shaped discrete cavity 717 may vertically extend through the entire thickness of the second substrate 708. In one embodiment, the pillar-shaped discrete cavities 717 may have substantially vertical sidewalls.

In an embodiment, the plurality of pillar-shaped discrete cavities 717 may be formed by placing an assembly of the first wafer 900 and the second wafer 700 such that the second wafer 700 overlies the first wafer 900, by covering a top surface of the second wafer with a patterned etch mask layer (such as a lithographically patterned photoresist layer) including discrete openings, and by transferring a pattern of the discrete openings through the second substrate 708 to form pillar-shaped discrete cavities 717. The etch process may use a dry etch process (such as an anisotropic etch process) or a wet etch process. For example, a wet etch process using a KOH solution may be used to form the plurality of trenches 707. In this case, the plurality of pillar-shaped discrete cavities 717 may have tapered sidewalls or contoured sidewalls with a taper angle in a range from 20 degrees to 70 degrees. The maximum lateral dimension (which may be a diameter) of each trench 707 may be in a range from 50 microns to 2 mm, although lesser and greater widths may also be used.

Referring to FIG. 8, an isotropic etch process may be performed to apply an isotropic etchant that etches the material of the sacrificial material layer 703 into the plurality of voids through the second substrate 708, i.e., into the plurality of pillar-shaped discrete cavities 717. In one embodiment, the isotropic etchant may be provided into the plurality of voids as a wet etch chemical in a wet etch process. For example, if the sacrificial material layer 703 includes silicon nitride, the isotropic etchant may include hot phosphoric acid. The isotropic etchant may etch the material of the sacrificial material layer 703 selective to the material of the etch barrier layer 704. The sacrificial material layer 703 may be removed by the isotropic etch process, and a perforated substrate semiconductor layer 709" derived from the second substrate semiconductor layer 709 may be detached from the remaining portions of the bonded assembly including the first wafer 900, the second semiconductor devices 710, and the second dielectric material layers 760 upon removal of the sacrificial material layer 703.

The bonded assembly includes a plurality of semiconductor chips including a respective pair of a first semiconductor die 950 and a remaining portion of a second semiconductor die 750.

Figure 9:
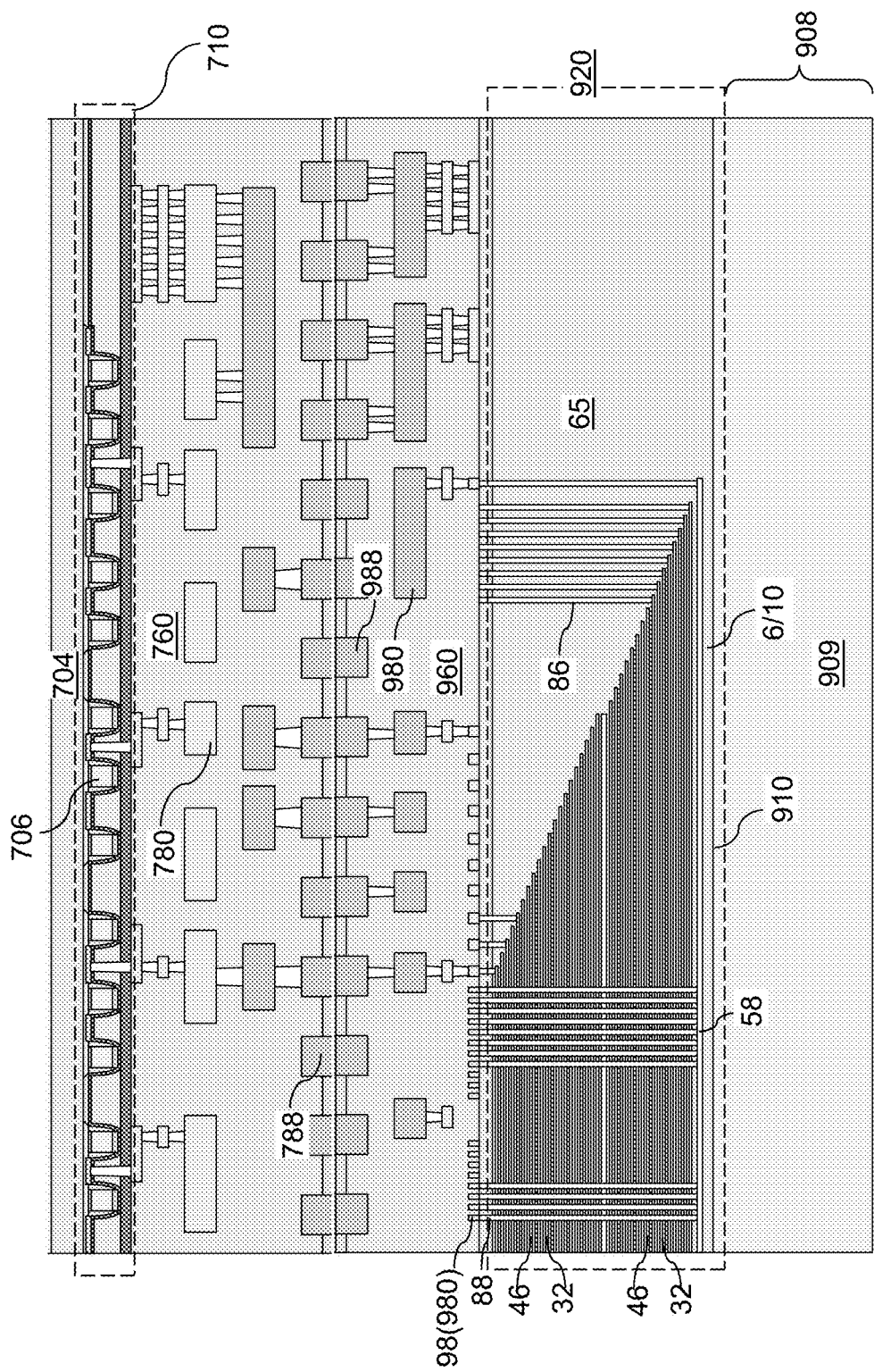
FIG. 9 is a vertical cross-sectional view of a bonded die that is present within the bonded assembly provided after the processing steps of FIG. 6 or after the processing steps of FIG. 8 according to an embodiment of the present disclosure.

Referring to FIG. 9, a semiconductor chip within the bonded assembly of the first wafer 900 and remaining portions of the second wafer 700 is illustrated. The structure of FIG. 9 may be derived from the structure of FIG. 6 or from the structure of FIG. 8. A proximal surface of the etch barrier layer 704 that is proximal to the interface between the first dielectric material layers 960 and the second dielectric material layers 760 may contact the semiconductor material layer 706, and a distal surface of the etch barrier layer 704 may be physically exposed.

Figure 10:
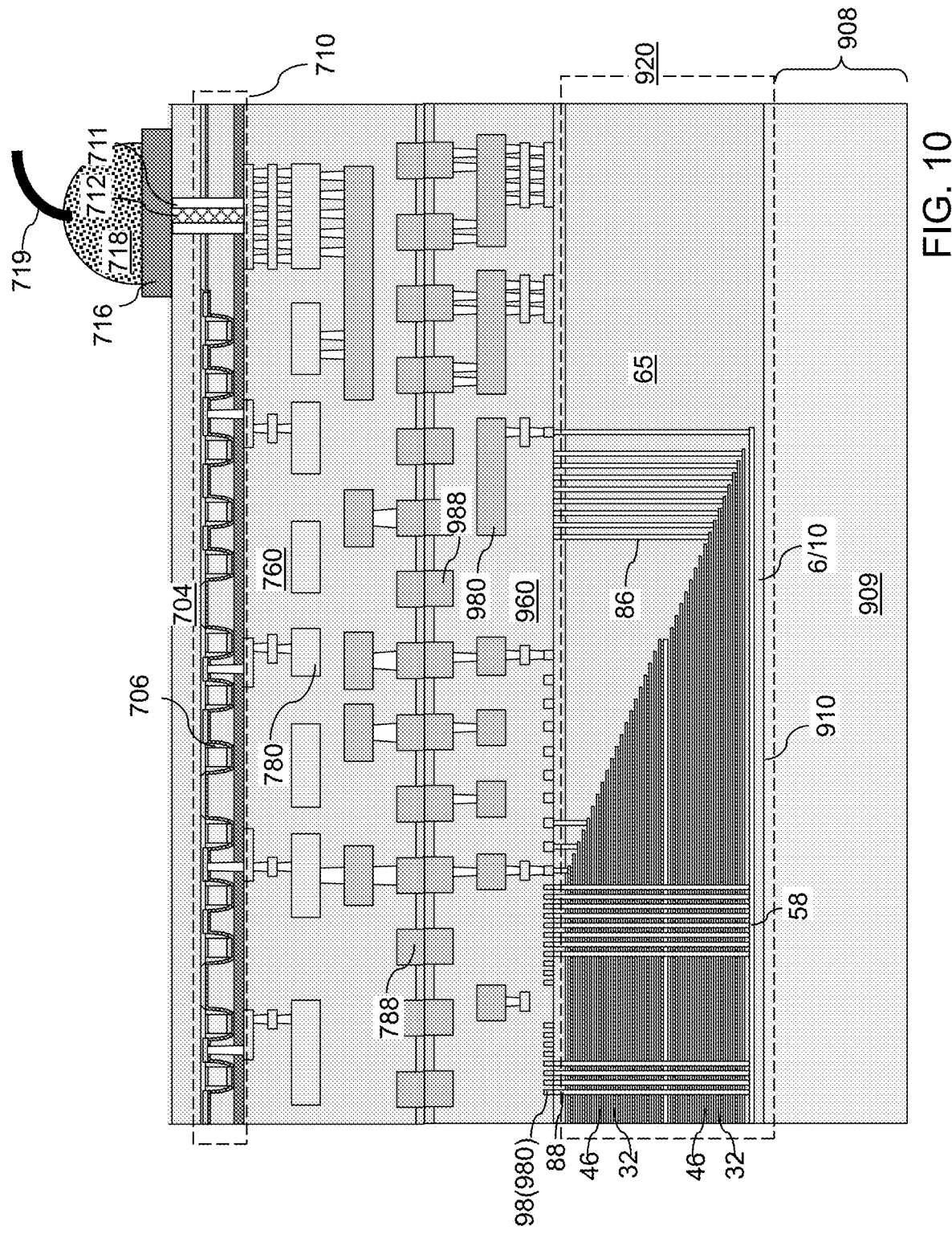
FIG. 10 is a vertical cross-sectional view of a bonded die after formation of external bonding pads, solder material portions, and bonding wires according to an embodiment of the present disclosure.

Referring to FIG. 10, through-substrate via cavities may be formed through the etch barrier layer 704, the semiconductor material layer 706, and a subset of layers within the second dielectric material layers 760 to a horizontal surface of a respective one of the second metal interconnect structures 780. In one embodiment, a subset of the second metal interconnect structures 780 to which the through-substrate via cavities extend may have pad structures to facilitate formation of conductive via structures thereupon. An insulating spacer 711 may be formed at a periphery of each through-substrate via cavity by conformal deposition of a conformal dielectric material layer and by an anisotropic etch process that removes horizontal portions of the conformal dielectric material layer. At least one conductive material may be deposited directly on an underlying physically exposed surface of a second metal interconnect structure within each void that is laterally surrounded by an insulating spacer 711 to form a through-substrate via structure 712.

An underbump metallurgy (UBM) layer stack may be subsequently deposited over the horizontal portion of the at least one conductive material. The UBM layer stack and the at least one conductive material may be patterned over the etch barrier layer 704 to form external bonding pads 716. Solder material portions 718 may be formed on the external bonding pads 716. A bonding wire 719 is attached to each of the solder material portions 718 to electrically connect the external bonding pads 716 to electrical nodes of an external structure such as a packaging substrate or a printed circuit board.

The various methods of the present disclosure provide easy removal of the second substrate semiconductor layer 709 through use of a plurality of voids (707, 717) that extend through the second substrate semiconductor layer 709. A significant portion of the second substrate semiconductor layer 709 may be removed as a solid structure such as the substrate material strips 709' or as the perforated substrate semiconductor layer 709". In one embodiment, more than 90%, such as more than 95% and/or more than 98%, of the entire volume of the second substrate semiconductor layer 709 may be removed as the substrate material strips 709' or as the perforated substrate semiconductor layer 709". Thus, the amount of material of the second substrate semiconductor layer 709 that is removed by an etch process may be minimized. Further, the methods of the present disclosure do not use grinding, and avoids generation of fine particles from the second substrate semiconductor layer 709. Thus, the methods of the present disclosure are environment-friendly as well as being cost-effective compared to prior methods for removing a substrate by grinding.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
providing a first wafer including a first substrate, first semiconductor devices overlying the first substrate, and first dielectric material layers and first metal bonding pads overlying the first semiconductor devices;
forming a sacrificial material layer over a top surface of a second wafer including a second substrate;
forming second semiconductor devices, second dielectric material layers and second metal bonding pads over a top surface of the sacrificial material layer;
attaching the second wafer to the first wafer such that the second dielectric material layers face the first dielectric material layers, and the first bonding pads are bonded to the second bonding pads;
forming a plurality of voids through the second substrate such that surfaces of the sacrificial material layer are physically exposed underneath the plurality of voids; and
removing the sacrificial material layer by providing an etchant that etches a material of the sacrificial material layer through the plurality of voids, wherein the second substrate is detached from a bonded assembly including the first wafer, the second semiconductor devices, the second bonding pads, and the second dielectric material layers upon removal of the sacrificial material layer.

2. The method of claim 1, further comprising forming an etch barrier layer on a top surface of the sacrificial material layer, wherein the second semiconductor devices are formed over the etch barrier layer, and wherein the etchant etches the material of the sacrificial material layer selective to a material of the etch barrier layer.

3. The method of claim 2, wherein the etchant is provided into the plurality of voids as a wet etch chemical in a wet etch process.

4. The method of claim 2, further comprising forming a semiconductor material layer over a top surface of the etch barrier layer, wherein the second semiconductor devices are formed on top of the semiconductor material layer.

5. The method of claim 4, wherein the etch barrier layer comprises a first silicon oxide layer, and wherein the method further comprises:
providing a single crystalline semiconductor wafer having a second silicon oxide layer on a top portion thereof;
forming a hydrogen implanted layer within the single crystalline semiconductor wafer by implanting hydrogen atoms through the second silicon oxide layer;
bonding the second silicon oxide layer to the first silicon oxide layer; and
separating a distal portion of the single crystalline semiconductor layer that is more distal from the second silicon oxide layer than the hydrogen implantation layer is from the second silicon oxide layer, wherein a proximal portion of the single crystalline semiconductor layer that is attached to the second silicon oxide layer constitutes the semiconductor material layer.

6. The method of claim 4, wherein the semiconductor material layer comprises a polycrystalline semiconductor material layer that is formed by deposition of a polycrystalline semiconductor material on a top surface of the etch barrier layer or by deposition of an amorphous semiconductor material on the top surface of the etch barrier layer and a subsequent thermal anneal process that converts the amorphous semiconductor material into a polycrystalline semiconductor material.

7. The method of claim 1, wherein:
the first wafer as provided comprises a plurality of first semiconductor dies; and
each of the first semiconductor dies comprises a respective subset of the first semiconductor devices; and
each of the plurality of first semiconductor dies has an identical size and an identical pattern.

8. The method of claim 7, wherein:
the second wafer after formation of the second semiconductor devices and the second dielectric material layers comprises a plurality of second semiconductor dies; and
each of the second semiconductor dies comprises a respective subset of the second semiconductor devices.

9. The method of claim 8, wherein:
the first metal bonding pads are formed within the first dielectric material layers at a surface portion thereof;
the second metal bonding pads are formed within the second dielectric material layers at a surface portion thereof; and
each of the second metal bonding pads is bonded to a respective one of the first metal bonding pads upon attaching the second wafer to the first wafer.

10. The method of claim 1, wherein:
the second substrate comprises a single crystalline silicon substrate;
the second substrate has a thickness in a range from 300 microns to 2,000 microns; and
the sacrificial material layer has a thickness in a range from 100 nm to 5,000 nm.

11. The method of claim 1, wherein a maximum lateral distance between each neighboring pair of voids selected from the plurality of voids is in a range from 1 mm to 25 mm.

12. The method of claim 1, wherein forming the plurality of voids comprises forming a plurality of trenches having a respective pair of straight edges that laterally extend from one side of a periphery of the second substrate to another side of the periphery of the second substrate.

13. The method of claim 12, wherein the straight edges of the plurality of trenches are substantially vertical and are parallel to one another.

14. The method of claim 12, wherein the plurality of trenches is formed by dicing the second substrate into multiple disjoined substrate material strips using a dicing saw.

15. The method of claim 12, wherein the plurality of trenches is formed by:
- placing an assembly of the first wafer and the second wafer such that the second wafer overlies the first wafer;
- covering a top surface of the second wafer with a patterned etch mask layer including line-shaped openings; and
- transferring a pattern of the line-shaped openings through the second substrate.

16. The method of claim 1, wherein forming the plurality of voids comprises forming a plurality of pillar-shaped discrete cavities that are laterally spaced apart from one another.

17. The method of claim 16, wherein the plurality of pillar-shaped discrete cavities are formed as a periodic two-dimensional array of pillar-shaped discrete cavities.

18. The method of claim 16, wherein the plurality of pillar-shaped discrete cavities is formed by:
- placing an assembly of the first wafer and the second wafer such that the second wafer overlies the first wafer;
- covering a top surface of the second wafer with a patterned etch mask layer including discrete openings; and
- transferring a pattern of the discrete openings through the second substrate.

19. The method of claim 1, wherein:
the first semiconductor devices comprise a three-dimensional array of memory elements; and
the second semiconductor devices comprise a peripheral circuitry configured to control operation of the three-dimensional array of memory elements.

20. The method of claim 1, wherein:
the second semiconductor devices comprise a three-dimensional array of memory elements; and
the first semiconductor devices comprise a peripheral circuitry configured to control operation of the three-dimensional array of memory elements.

* * * * *